United States Patent [19]

Ainsworth

[11] Patent Number: 4,626,777

[45] Date of Patent: Dec. 2, 1986

[54] D.C. CURRENT TRANSFORMER CIRCUITS

[75] Inventor: John D. Ainsworth, Stafford, England

[73] Assignee: Associated Electrical Industries Limited, England

[21] Appl. No.: 590,908

[22] Filed: Mar. 19, 1984

[30] Foreign Application Priority Data

Apr. 8, 1983 [GB] United Kingdom ............... 8309559

[51] Int. Cl.⁴ .................. G01R 33/00; G01R 1/22; G01R 19/14
[52] U.S. Cl. ..................... 324/117 R; 324/127; 324/133
[58] Field of Search ............ 324/117 R, 127, 133; 307/401; 330/8

[56] References Cited

U.S. PATENT DOCUMENTS

| | | | |
|---|---|---|---|
| 2,657,281 | 10/1953 | Kluz | 330/8 |
| 2,892,155 | 6/1959 | Radus et al. | 324/117 R |
| 3,135,911 | 6/1964 | Van Allen | 323/332 |
| 3,351,851 | 11/1967 | Darling | 323/240 |
| 3,699,442 | 10/1972 | Riley | 324/117 R |
| 3,855,528 | 12/1974 | Brown | 324/117 R |

FOREIGN PATENT DOCUMENTS

| | | |
|---|---|---|
| WO82/002253 | 7/1982 | PCT Int'l Appl. |
| 0552815 | 4/1943 | United Kingdom . |
| 0661067 | 11/1951 | United Kingdom . |
| 0934901 | 8/1963 | United Kingdom . |
| 1084566 | 9/1967 | United Kingdom . |
| 1169683 | 11/1969 | United Kingdom . |
| 0759964 | 9/1980 | U.S.S.R. .................. 324/117 R |

OTHER PUBLICATIONS

M. R. G. Petersen; "High Current Propulsion System"; 1979, IEEE Electronics Specialists Conference; pp. 379–384.

*Primary Examiner*—Ernest F. Karlsen
*Assistant Examiner*—Vinh P. Nguyen
*Attorney, Agent, or Firm*—Kirschstein, Kirschstein, Ottinger & Israel

[57] ABSTRACT

A D.C. current transformer (used for measuring D.C.) comprising a common primary winding and a pair of saturable magnetic cores on which respective secondary windings are wound and connected in opposite series in series to a source of alternating e.m.f., is provided with phase-sensitive device for determining the sense of the unknown D.C. in the primary winding. The phase sensitive device periodically senses and integrates the voltage (whose waveform is the −45° to +45° portion of a sine wave) across at least one of the secondary windings. The sense of the integrated waveform depends on whether said voltage is initially positive or negative, and is determined by the sense of the unknown D.C. in the primary winding. Preferably said voltage is sensed at each half cycle of said alternating e.m.f.

9 Claims, 4 Drawing Figures

D.C. CURRENT TRANSFORMER CIRCUITS

The present invention relates to circuit arrangements incorporating D.C. current transformers.

Such transformers comprise a pair of interconnected electrical windings (subsequently referred to as secondary windings) magnetically linked to respective independently saturable cores which are in turn adapted to be magnetically linked to a common circuit in which an unknown direct current flows, the arrangement of cores and windings being such that any current passed through the interconnected secondary windings tends to augment the flux produced by the D.C. in one core and to oppose the corresponding flux in the other core. The secondary windings are connected in opposite senses in series.

In measuring circuits incorporating such transformers, means for applying an alternating e.m.f. across the free ends of the secondary windings and means for measuring the resulting alternating current in the secondary windings are provided. Each core is in the form of a laminated ring, which, in use, encircles a conductor in the D.C. circuit which thus forms a single turn primary winding common to the respective secondary windings. It can be shown that, with suitable core saturation characteristics, the secondary current is A.C. of substantially square waveform, and that the ratio of the primary to the secondary current is inversely proportional to the primary: secondary turns ratio, even though the current in the primary is D.C. D.C. current transformers thus exhibit true transformer characteristics, although their mode of operation is different from conventional A.C. transformer operation.

Hitherto, D.C. current transformer circuit arrangements have provided only an indication of the absolute magnitude of the D.C. in the primary circuit, and not an indication of its sense.

An object of the present invention is to overcome this defect. It will be appreciated that conventional magnetic arrangements for indicating the sense of the unknown D.C. will generally be precluded for the same reasons that dictate the use of a current transformer in the first place.

According to the present invention, a D.C. current transformer measuring circuit arrangement comprises (a) a D.C. current transformer provided with a current-carrying primary winding and a pair of inter-connected secondary windings magnetically coupled in opposite senses to said primary winding by respective saturable cores, (b) signal means for applying an alternating e.m.f. across the ends of said secondary windings, and (c) means for measuring the resulting alternating current in said windings, wherein the improvement comprises phase sensitive means connected across at least one of said secondary windings for determining the phase with respect to said alternating e.m.f. of the voltage across said at least one secondary winding and thereby providing an indication of the sense of the primary current. Preferably the phase-sensitive means senses said voltage at least once per cycle of said alternating e.m.f. Preferably the phase-sensitive means comprises integrating means which integrates said voltage. Preferably the integrating means is periodically re-set immediately after the core associated with said winding de-saturates. Preferably the voltage sensing means sums the voltages across the secondary windings. This enables the voltage sensing means to detect a reversal of the measured D.C. within one half cycle of the signal means. Such a rapid response time is useful in D.C. Motor control applications, for example.

Particular embodiments of the invention will now be described by way of example with reference to FIGS. 1 to 4 of the accompanying drawings, of which:

Figure 1:
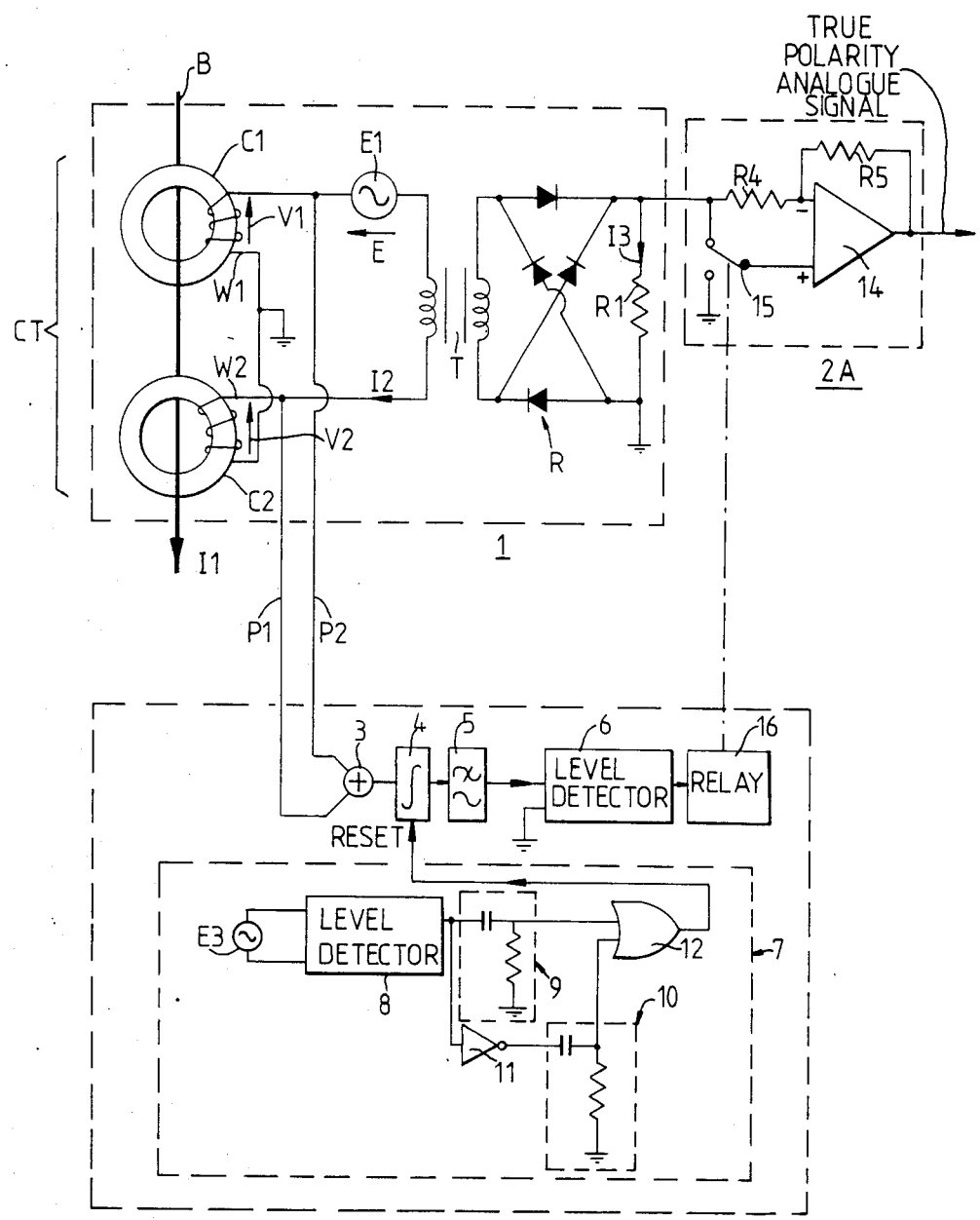
FIG. 1 is a circuit diagram showing a two-core D.C. current transformer measuring circuit in accordance with the invention.

Referring to FIG. 1, the arrangement shown generally comprises a known D.C. current transformer measuring circuit arrangement 1, a polarity sensing circuit arrangement 2 and a gain-reversible amplifier circuit 2A. Circuit arrangement 1 comprises a D.C. current transformer CT consisting of two magnetically saturable ring cores C1 and C2 on which respective windings W1 and W2 are wound and connected in series so as to tend to generate m.m.f.'s, which respectively oppose and augment any m.m.f. generated by a current in a central busbar B. Cores C1 and C2 are each shown encircling busbar B which carries a current I1 (typically of hundreds or even thousands of amps). Thus busbar B forms a single turn primary common to secondary windings W1 and W2. The secondary circuit of current transformer CT incorporates a low impedance signal source E1 which generates an alternating e.m.f.E, typically at 200 V, 50 or 60 Hz. The secondary circuit is coupled by a transformer T to a bridge rectifier R which generates a current I3 in load resistor R1. I3 is measured by a conventional ammeter (not shown) and can be shown to be directly proportional to I1 if certain conditions are satisfied. The sense of I3 is independent of the sense of I1 however; the latter is detected by polarity-sensing circuit 2 and output as a positive or negative D.C. signal by gain-reverisible amplifier circuit 2A.

Figure 2:
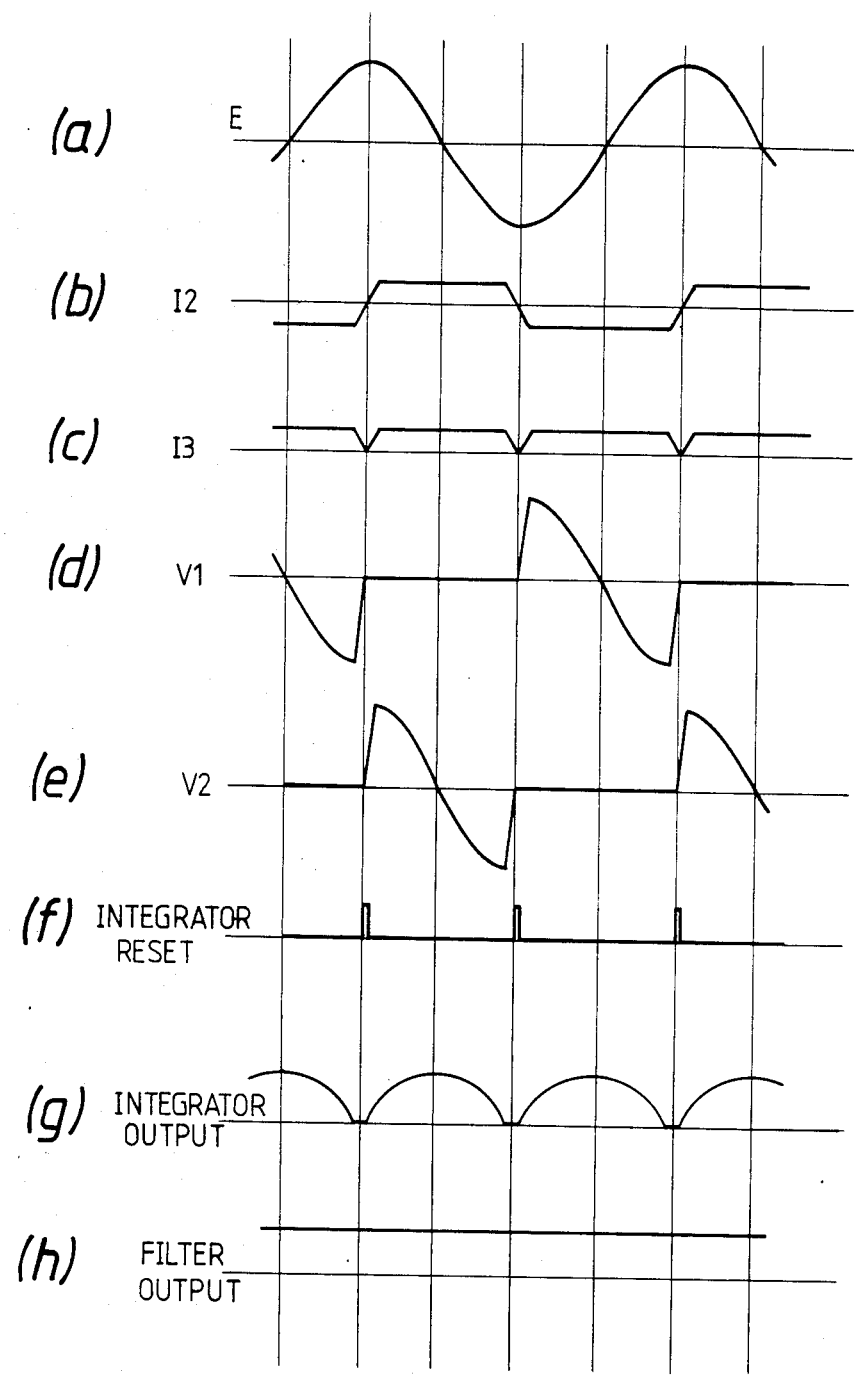
FIG. 2 shows various voltage and current waveforms in the circuit arrangement of FIG. 1.

The operation of circuit arrangement 1 may be understood by reference to plots (a), (b), (c), (d) and (e) of FIG. 2, which show respectively the waveforms of the e.m.f.E of source E1, the current I2 in the secondary circuit of current transformer CT, the current I3 in load resistor R1 and the voltages V1 and V2 developed across secondary windings W1 and W2.

The amplitude of e.m.f.E is chosen to be sufficiently low that the resulting flux in cores C1 and C2 is insufficient to saturate them in the absence of current in busbar B. Thus in the absence of current in busbar B windings W1 and W2 would merely behave as high inductances and waveform I2 would be a sine wave of negligible amplitude lagging E by 90°. However, current I1 generates m.m.f.'s in cores C1 and C2 which tend to saturate both cores but in opposite senses.

When I2 is positive, i.e., in direction indicated, only core C1 completely saturates because any saturation of core C2 would lower the impedance of the secondary circuit and allow current I2 to rise sufficiently to generate an m.m.f. in winding W2 which would drive core C2 out of saturation. The situation reverses when I2 is negative. Thus at each zero crossing point of I2, the secondary current rapidly rises to an equilibrium value which is just sufficient to prevent one of cores C1 and C2 from saturating. This value depends on the numbers of turns (assumed equal) in windings W1 and W2 and the current I1. I3 is the rectified current corresponding to I1. The magnitudes of V1 and V2 are either equal to E (neglecting the primary impedance of transformer T) or are substantially zero, depending on whether or not their associated cores are unsaturated.

Polarity sensing circuit 2 utilises V1 and V2 in order to determine the direction of current I1. It should be noted that if current I1 flows in the reverse direction to that shown, I2 will be unaffected. However in each half cycle of I2, the core which is saturated will be that which reinforces the flux due to I1. Since V1 and V2 are developed across the unsaturated core, waveforms V1 and V2 will interchange (and furthermore, be it noted, will undergo a 180° phase change) when I1 reverses.

Adder 3 sums V1 and V2, the common terminal of W1 and W2 being earthed and taken as a reference point. It should be noted that the output of adder 3 will reverse when I1 reverses. The output of adder 3 is integrated by integrator 4 which is reset at each zero crossing point of I2, the integration thus enduring for one half cycle. The polarity of the output of integrator 4 is dependent on the phase of the output signal from adder 3 and hence on the direction of I1. This output is filtered by low-pass filter 5 and applied to level detector 6 which generates a corresponding two-level logic signal, dependent on whether the output of filter 5 is positive or negative.

As described above, signal outputs are available respectively as voltages across $R_1$ (or current in it) proportional to input current magnitude, and a 2-level logic signal indicating polarity. This may suffice for simple applications. For example to operate a numerical digital display of input current the magnitude signal I3 may be smoothed (to reduce the effect of the notches in FIG. 2c) and applied to an analogue to digital converter (not shown), which delivers a digital output to operate an illuminated numerical display; the polarity signal from level detector 6 may be used to illuminate + or − symbols preceding the numerical display.

For control or protective applications an analogue output having true polarity (i.e. polarity as for the input current) may be required. This may be obtained by taking output from the magnitude signal I2 via reversing switches on a relay switched by the polarity signal. The relay is preferably of the static type having semiconductor switches controlled directly from the output level detector 6.

However in the arrangement shown in FIG. 1, output is taken from the magnitude output I3 via an amplifier circuit 2A having a gain switchable from +1 to −1 by the polarity logic signal. The amplifier circuit 2A comprises a differential operational amplifier 14 of high gain, with equal gain control resistors $R_4$ and $R_5$; its gain is switched via a change-over switch 15 controlled by relay 16. Again the electromechanical relay may advantageously be replaced by an equivalent static semiconductor switch. If preferred, the positive and negative amplifier gains may be made of equal magnitude other than the unity value shown, by known methods.

Integrator 4 is re-set by pulses as shown in FIG. 2f. These are generated by re-set circuit 7 in which a second auxiliary voltage source $E_3$ in phase quadrature to $E_1$ is connected via a level detector 8 which delivers a square wave output having transitions at the zero crossings of $E_3$. Two differentiating circuits 9, 10 are connected respectively directly to the output of 8, and via a logic reverse circuit 11 to generate short pulses. The combination of the short pulse outputs of 9, 10 via OR-gate 12 (shown in the waveform of FIG. 2(f)) then provides the desired integrator reset pulses.

It will be apparent that the invention includes within its scope polarity sensing circuit arrangements which merely rely on sensing one or other of V1 and V2 (although the response time is minimised if both are sensed) and that means for determining the phase of V1 and or V2 other than integrators may be used. Furthermore it will be apparent that integration periods longer than one half cycle may be employed (preferably still with I2-determined starting points), although the arrangement illustrated has particular advantages of simplicity, rapid response time, and reliability.

Figure 3:
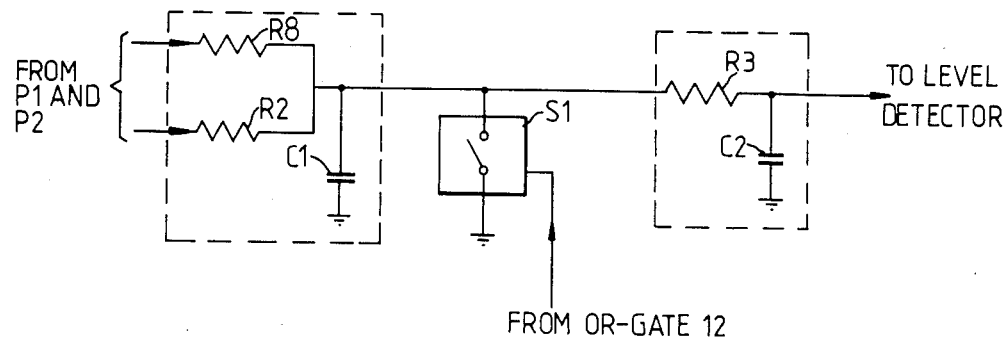
FIG. 3 shows one practical realisation of certain elements of FIG. 1.

A simple implementation of elements 3, 4, 5 of FIG. 1 is shown in FIG. 3 in which voltages V1 and V2 are combined via equal resistors R8, R2 and integrated by capacitor C1. The low-pass filter 5 comprises resistor R3 and capacitor C2. Reset of the integrator is by momentary closure of electronic switch S1.

The arrangement of FIG. 1 described above has the disadvantage of "notches" in the output waveform as shown in FIG. 2(c). This is undesirable in control applications where perturbations caused by the notches may necessitate filtering to reduce their effect; filters cause extra lag in the response, which is detrimental in control systems. In addition the "current-time" area of the notches causes non-linear errors in the d.c. measurement.

It is known to use two identical such circuits as 1 in FIG. 1 with a total of 4 main current transformer cores, in which the two respective a.c. auxiliary supply voltages are in phase quadrature, and the outputs of the two bridge rectifiers are connected in series before application to a common burden resistor $R_1$.

Assuming identical turns ratios on corresponding transformers, the respective a.c. secondary currents are identical trapezoids as before (FIG. 2b) but at 90° relative phase. Because of the series bridge connection the current I3 to the burden resistor is unidirectional and equal to the highest magnitude of either of the a.c. currents from the auxiliary current transformers at every instant; it is therefore smooth d.c., with an ampere-turn balance relationship to main primary current $I_1$. The elimination of notches removes the necessity to provide a smoothing filter, with its attendant lag, and substantially improves accuracy.

Figure 4:
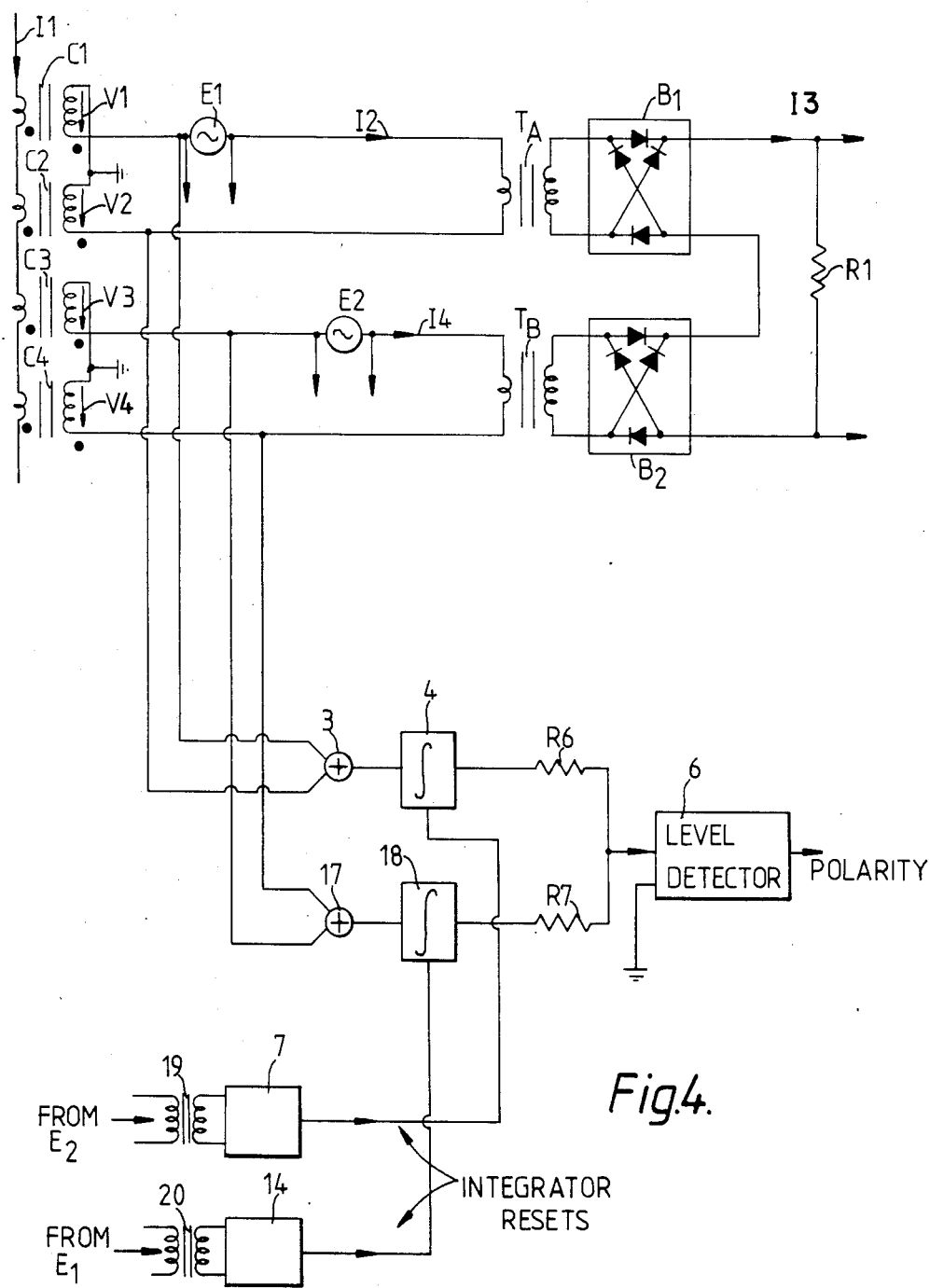
FIG. 4 is a schematic circuit diagram of a four-core D.C. current transformer measuring arrangement in accordance with the invention.

A polarity-sensing circuit may be applied to the 4-core current transformer, as shown in FIG. 4. The respective pairs of main current transformer cores are C1, C2 and C3, C4 (shown schematically), supplied by auxiliary voltages $E_1$ $E_2$ respectively, in phase quadrature. The winding voltages are V1, V2 and V3, V4 respectively, which are summated by summers 3, 17 and integrated by integrators 4, 18. The outputs of the integrators are combined via equal resistors R6, R7 and applied to a level detector 6 as before, but without the low-pass filter 5. Integrator reset signals are applied to 4 via circuit 7 as before and to 18 via identical circuit 14. The inputs to 7, 14 are from $E_2$ and $E_1$ respectively via isolating transformers 19, 20.

The waveform applied to level detector 6 for positive input current has a 4-phase ripple but is wholly positive at every instant, giving a steady logic level output from 6 indicating positive polarity. For a reversed polarity of I1 the input to 6 reverses, and the output of 6 changes its logic level to that indicating negative polarity. Because the low-pass filter is omitted in this circuit, the response of the polarity indication signal is fast, within about a half cycle of current reversal, which gives an improved response for control and other applications. The reversing arrangements described above may be applied to the output as before.

The principles of the 4-core arrangement may be applied also to a 6-core arrangement. For the latter the three pairs of current transformers are supplied by auxiliary voltages at relative phase angles of 0°, 120° and 240°, i.e. from 3-phase supply. There are in this case three integrators with outputs combined as before. These require three reset circuits similar to 7 but supplied with voltages each in quadrature to the respective main auxiliary voltages, obtained from suitable windings on a 3-phase transformer.

I claim:

1. A measuring circuit arrangement comprising:
   (a) a D.C. current transformer provided with a current-carrying primary winding and a pair of interconnected secondary windings magnetically coupled in opposite senses to said primary winding by respective saturable cores,
   (b) signal means for applying an alternating e.m.f. across the ends of said secondary windings,
   (c) means responsive to the resulting alternating current in said windings, and
   (d) phase sensitive means for integrating the voltage across at least one of said secondary windings and determining the phase with respect to said alternating e.m.f. of the voltage across said at least one secondary winding and for thereby providing an indication of the sense of the primary current.

2. A circuit arrangement according to claim 1 wherein said phase-sensitive means is arranged to integrate said voltage over one cycle of said alternating e.m.f.

3. A circuit arrangement according to claim 2 wherein said phase-sensitive means is arranged to integrate said voltage over one half-cycle of said alternating e.m.f.

4. A circuit arrangement according to claim 3, further comprising means for periodically re-setting said integrating means immediately after a core of said transformer de-saturates.

5. A circuit arrangement according to claim 3 wherein said phase-sensitive means is sensitive to the sum of the voltages across said secondary windings.

6. A circuit arrangement according to claim 5 as dependent on claim 4, further comprising means for feeding a D.C. signal whose amplitude is proportional to the absolute magnitude of the current through said primary to the input of a gain-switchable amplifier, the gain of which is switchable between two values of equal magnitude but of opposite sign in dependence upon the polarity of the output of said integrating means.

7. A circuit arrangement according to claim 6 wherein said values of gain are equal to plus and minus unity.

8. An arrangement as claimed in claim 3 comprising two or more D.C. current transformers with a common primary and respective pairs of series-connected secondary windings fed with respective alternating e.m.f.'s relatively displaced in phase, wherein said pairs of secondary windings are connected to respective voltage integrating means which are periodically reset in response to said respective e.m.f.'s and the outputs of which are combined to indicate the sense of the primary current.

9. A measuring circuit as claimed in claim 1 wherein said cores are ring cores and said primary winding is a current-carrying conductor passing through both of said cores.

* * * * *